(12) United States Patent
Orsillo

(10) Patent No.: US 6,408,500 B1
(45) Date of Patent: Jun. 25, 2002

(54) METHOD OF RETROFITTING A PROBE STATION

(76) Inventor: James Orsillo, P.O. Box 68991, Portland, OR (US) 97268

( * ) Notice: Subject to any disclaimer, the term of this patent is extended or adjusted under 35 U.S.C. 154(b) by 46 days.

(21) Appl. No.: 09/662,735

(22) Filed: Sep. 15, 2000

(51) Int. Cl.$^7$ ............................................... B23P 17/04
(52) U.S. Cl. ..................... 29/401.1; 29/402.06; 324/758
(58) Field of Search ........................... 29/401.1, 402.01, 29/402.04, 402.06, 402.08, 402.09, 402.14, 402.15, 557; 324/754, 758

(56) References Cited

U.S. PATENT DOCUMENTS 5,528,158 A * 6/1996 Sinsheimer et al. ........ 324/758
6,060,892 A * 5/2000 Yamagata ................... 324/754
6,166,553 A * 12/2000 Sinsheimer ................. 324/754
6,304,092 B1 * 10/2001 Jordan ........................ 324/758

* cited by examiner

Primary Examiner—S. Thomas Hughes
Assistant Examiner—Jermie E. Cozart
(74) Attorney, Agent, or Firm—Timothy E. Siegel

(57) ABSTRACT

A method of retrofitting a probe station having a head plate, so that the probe station is adapted to mate with a predetermined probe card dish and any tester out of a set of testers. A depression is then machined into the head plate to create a head plate-tooling plate attachment region. Next, fastening and alignment items are provided and installed in this region. Further, a set of tooling plates are provided, each having fastening and alignment items adapted to mate to the fastening and alignment items on the attachment regions and defining an aperture designed to engage the predetermined probe card dish. The user may then select a desired one of the tooling plates and mate and fasten the selected tooling plate to the head plate-tooling plate attachment region using the alignment and fastening items.

10 Claims, 4 Drawing Sheets

METHOD OF RETROFITTING A PROBE STATION

BACKGROUND OF THE INVENTION

In the semiconductor field, each set of wafers fabricated is typically performance tested, before they are diced into individual integrated circuits. FIGS. 1–4 show equipment that is used in this testing. Although these figures show an embodiment of the invention they also show some features that are shared with prior art systems. These features are referenced in this section to help explain the context of the invention.

To perform wafer testing a piece of equipment known as a probe station 10 has a head plate 12 that defines an original head plate aperture 14 FIG. 3. The aperture supports a circular device known as a probe card dish 16, which in turn supports the probe card 17. A separate piece of equipment, known as a tester 18 having docking units 20, is lowered into mating position with respect to the probe station, the probe card dish and the probe card. Sometimes probe station 10 includes an obstacle, such as a wafer loader cover 19, that is too close to the original-head plate aperture 14 to permit the docking of a particular tester 18.

Generally, a number of guides and associated docking equipment pieces are needed to successfully dock a tester to a probe station, a probe card dish and the wafer that the probe card dish supports. Probe stations are generally sold to semiconductor manufacturing facilities with this docking equipment already installed. Accordingly, when a new tester is purchased it is typically necessary to purchase a new probe station fitted with docking equipment to facilitate docking with the new tester. Unfortunately, the docking equipment, which is typically installed by the probe station vendor or a secondary source, generally permits docking to a single make of tester. The installation of docking equipment to permit the use of a different tester with the probe station is referred to in the industry as "hardware swap-out" and results in extensive use of technician time and equipment down time.

It is known to machine a single prober to accept a single tooling plate that permits docking to a desired tester. There appears, however, not to have been an effort in the prior art to produce a set of standardized tooling plates that could each be used on any one of a set of differing probe stations. As a result, only very limited flexibility was gained by this method.

Another issue facing semiconductor manufacturers is the lack of uniformity of head plate apertures, between the various commercial lines of probe stations. The unfortunate result is that there is currently no known technique for mating a probe station having a first head plate aperture size with a tester designed to mate with a prober having a second head plate aperture size.

SUMMARY OF THE INVENTION

In a first aspect, the present invention is a method of retrofitting a probe station having a head plate, so that the probe station is adapted to mate with a predetermined probe card dish and any tester out of a set of testers. A depression is machined into the head plate to create a head plate-tooling plate attachment region. Next, fastening and alignment items are provided and installed in this region. Further, a set of tooling plates is provided, each having fastening and alignment items adapted to mate to the fastening and alignment items on the attachment regions and defining an aperture designed to engage the predetermined probe card dish. The user may then select a desired one of the tooling plates and mate and fasten the selected tooling plate to the head plate-tooling plate attachment region using the alignment and fastening items.

In a second separate aspect, the present invention is a tooling plate for installation into a probe station. The plate comprises a rigid plate defining a major aperture and a set of peripheral apertures fitted with spring loaded, retained screws adapted to facilitate fastening to mating threaded holes.

In a third separate aspect, the present invention is a tooling plate for installation into a probe station, the plate comprising a rigid plate defining a major aperture and a set of dowel locater holes precisely set with respect to the location of the major aperture.

In a fourth separate aspect, the present invention is a method of retrofitting a probe station having a head plate that defines an original head plate major aperture, so that the probe station is adapted to mate with a predetermined probe card dish and a predetermined tester that the probe station could not mate with prior to being retrofitted. The method comprises the steps of machining a depression into the head plate to create a head plate-tooling plate attachment region. In addition, the head plate major aperture is enlarged and head plate-tooling plate attachment region fastening and alignment items are provided. Also provided is a tooling plate having tooling plate fastening and alignment items adapted to mate to the head plate-tooling plate attachment region fastening and alignment items and defining a tooling plate major aperture designed to engage the predetermined probe card dish and wherein the tooling plate major aperture is positioned relative to the tooling plate fastening and alignment items such that once the tooling plate is installed the tooling plate major aperture will not be coincident to the original head plate major aperture. Finally, the tooling plate is mated and fastened to the head plate-tooling plate attachment region, using the alignment and fastening items.

In a fifth separate aspect, a method of retrofitting a probe station having a head plate, so that it can mate with a tester that includes docking equipment that extends horizontally beyond the horizontal extent of the probe station. The method comprises machining at least one attachment region into the head plate and fitting the attachment region with alignment and fastening items and providing at least one docking equipment attachment plate, including a piece docking equipment, to mate to the attachment region. Then the docking equipment attachment plate is mated to the corresponding attachment region so that the docking equipment attachment plate protrudes horizontally outwardly from the head plate and supports the piece of docking equipment outwardly of the headplate.

In a sixth separate aspect, the present invention is a probe station capable of mating to a tester that has a larger footprint than the probe station. The probe station includes a headplate and at least one docking equipment supporting plate that extends outwardly from the headplate and supports at least one piece of docking equipment at a location distanced from the headplate.

In a seventh aspect, the present invention is a method of retrofitting a probe station having a head plate, so that the probe station is adapted to mate with a predetermined probe card dish and any tester out of a set of testers. Fastening and alignment items are provided and installed on the head plate. Further, a set of tooling plates is provided, each having fastening and alignment items adapted to mate to the fastening and alignment items on the head plate and defining an aperture designed to engage the predetermined probe card dish. The user may then select a desired one of the tooling plates and mate and fasten the selected tooling plate to the head plate using the alignment and fastening items.

The foregoing and other objectives, features and advantages of the invention will be more readily understood upon consideration of the following detailed description of the preferred embodiment(s), taken in conjunction with the accompanying drawings.

DETAILED DESCRIPTION OF THE PREFERRED EMBODIMENTS

Figure 3:
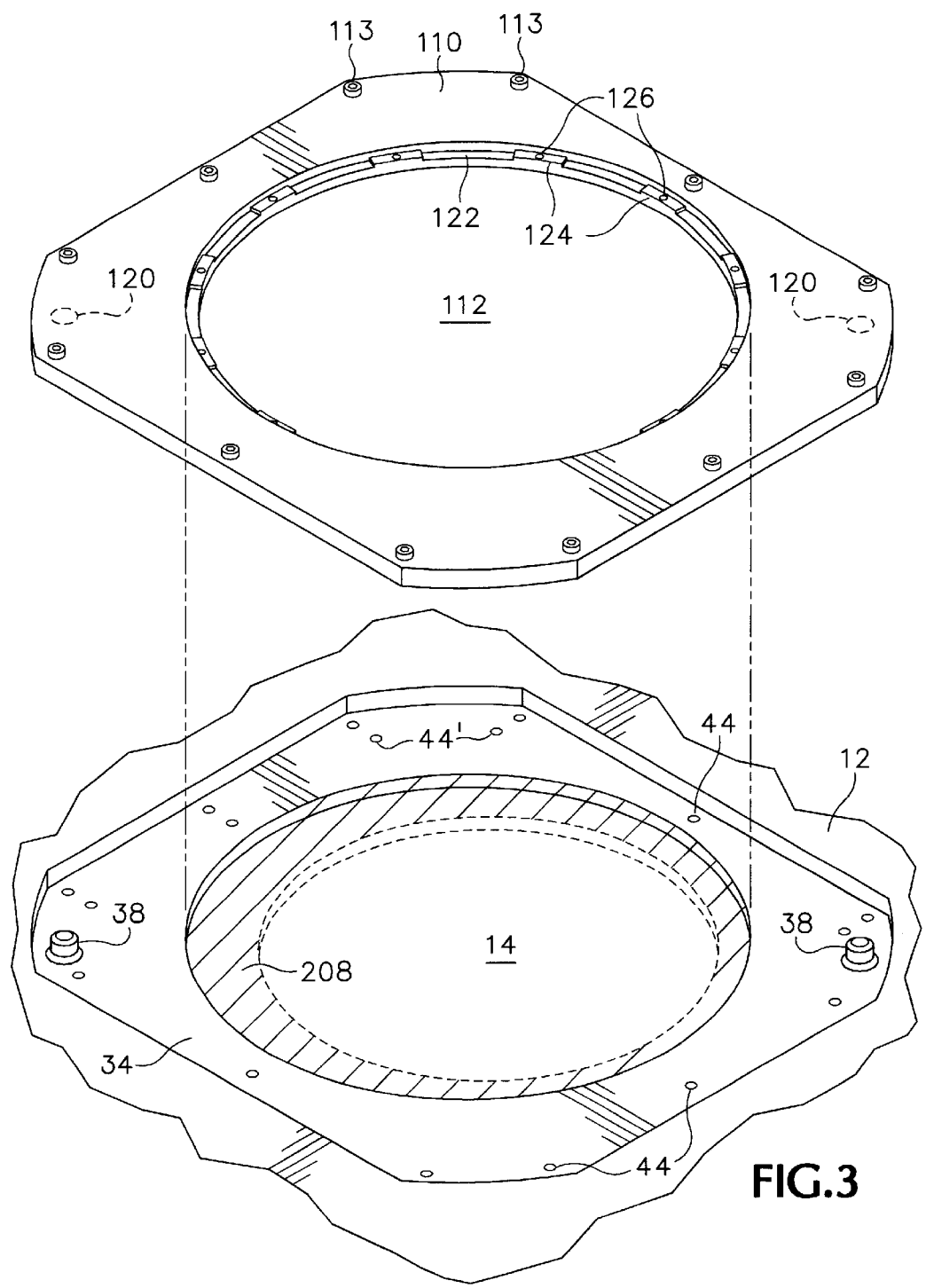
FIG. 3 is an exploded perspective view of a portion of the probe station of FIG. 1, showing some of the details of the retrofitting of the present invention.

To perform one preferred method of retrofitting a probe station according to the present invention, 0.3 mm (12 mils) of material is machined away from the top of the head plate 12 of the probe station 10 (both items have been introduced in the Background section) to form a head plate-tooling plate attachment region 34 (FIG. 3). A pair of through-holes (not shown) is drilled through the attachment region 34 of the head plate 12 to permit the attachment of a pair of dowel pins 38. Skilled persons will readily recognize that for this machining to be done the head plate 12 must be removed from the rest of the probe station 10.

Figure 1:
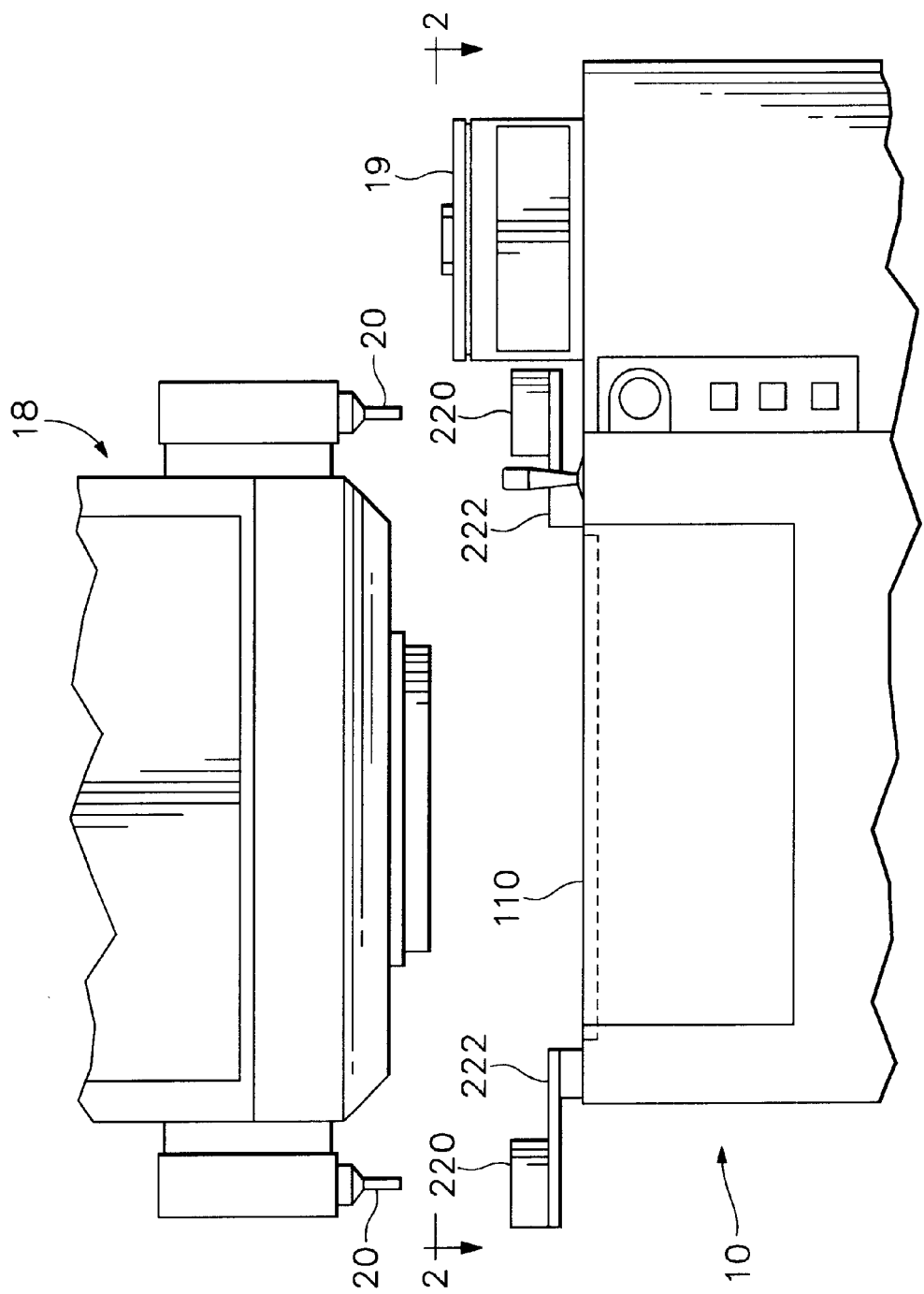
FIG. 1 is a side view of a probe station-tester mating pair wherein the probe station has been retrofitted according to the method of the present invention.
Figure 2:
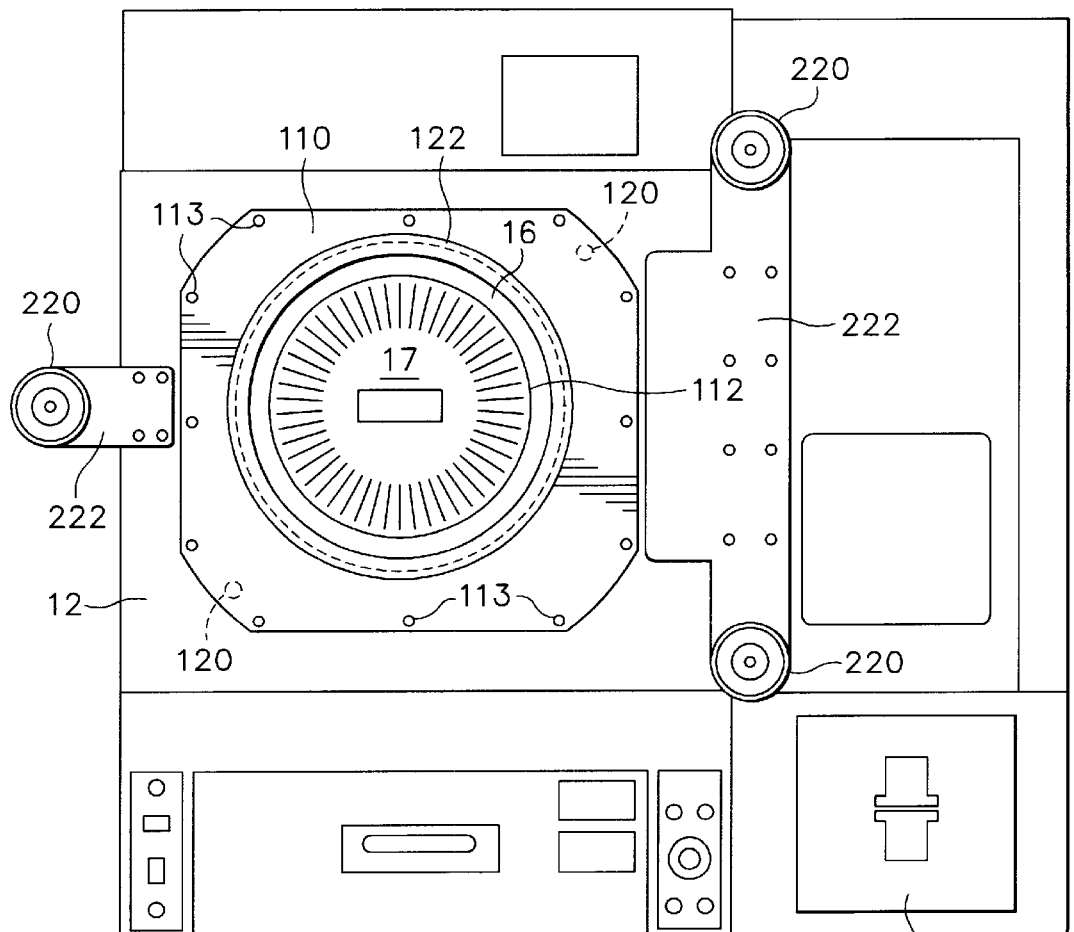
FIG. 2 is a top view of the probe station of FIG. 1.

In addition a sequence of threaded holes 44 are machined just inside the periphery of attachment region 34. The method of retrofitting a probe station that is the subject of the present invention is accomplished with the use of a tooling plate 110 as shown in FIGS. 1 and 2. Spring-loaded screws are set into a set of apertures 113, to permit the rapid attachment of plate 110 to a retrofitted probe station. The bottom side of plate 110 defines dowel pin locator holes 120, which are configured to mate with dowel pins 38 and thereby facilitate the precise positioning of plate 110. In one preferred embodiment the dowel pins 38 are sited with great precision relative to the center of aperture 14 to ensure correct alignment and positioning of a tooling plate 110.

Figure 4:
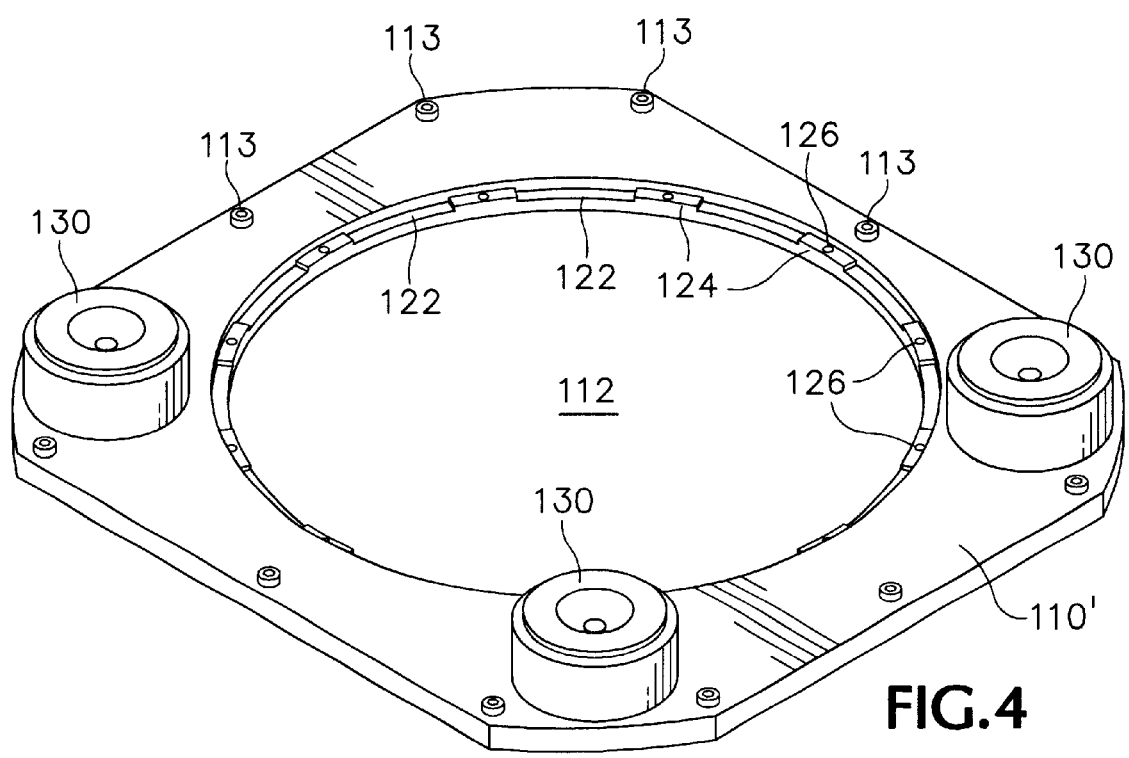
FIG. 4 is an exploded perspective view of a portion of a probe station that has been retrofitted in a manner similar to the method of FIG. 1, but with the docking equipment attached to the tooling plate.

The tooling plate 110, defines a tooling plate major aperture 112 for supporting a probe card dish. A rim 122, adapted for probe card dish attachment is defined about aperture 112. A set of bosses 124, each sunk with a threaded hole 126, ease the attachment of the probe card dish. Referring to FIG. 4, in some instances a set of docking equipment 130 is included as a part of an alternative tooling plate 110' so that the installation of plate 110' renders the probe station 10 ready to dock with a tester of choice 18.

Ideally, a number of tooling plates 110' could be provided, each one fitted with a distinct set of docking equipment 130 adapted to dock with a particular tester. In this manner, a semiconductor manufacturing facility that owns a number of testers and a number of probe stations could dock any one of a number of testers with any one of a number of probe stations. Moreover, if more than one probe station was retrofitted to accept any one out of a number of tooling plates 110', than any one of these testers could be placed in service with any probe station for which a matable plate 110' was available.

It should be expressly noted that by producing a set of tooling plates, each of which has a standardized set of location and attachment items, and by modifying a set of probe stations so that each one has a standardized set of location and attachment items designed to mate to the tooling plate location and attachment items, that a great flexibility can be achieved in the sense that any of the probe stations can be mated to any of the tooling plates and thereby to any tester for which such a tooling plate is available. This technique appears to be unknown in the prior art and can be applied even to probe stations of differing makes, such as the popular brands TSK®, TEL® and EG®.

In an alternative preferred embodiment, no depression is machined in head plate 12. Dowell pins 38 and threaded holes 44 are provided on the top surface of head plate 12 and a tooling plate 110 is attached on top of head plate 12.

In one preferred embodiment a second set of threaded holes 44' is provided in head plate attachment region 34 for the attachment of a smaller tooling plate 110. Such a smaller tooling plate 110 would typically be made to fit a probe station 10 having a smaller head plate. By providing the second set of threaded holes 44' a probe station,10 is made available for retrofitting with tooling plates 110 made primarily for a different line of probe stations 10 having smaller head plates 12.

Referring again to FIGS. 1–2, in some instances, a probe station will have a head plate that is fairly small and will, further, have an obstacle 19 such as the cover for the device that loads the wafers onto the probe card dish (the "loader cover"). It may not be possible to dock this type of probe station to a tester without moving the probe card dish location away from the obstacle. To do this, the original head plate aperture 14 is enlarged by region 208 (FIG. 3), and a tooling plate 210 is provided having a major aperture 212 that is not centered with respect to the remainder of the tooling plate 210. When tooling plate 210 is installed the major aperture 212 is located differently from the original head plate major aperture 14 and is further away from the obstacle, thereby permitting a tester of choice to dock to tooling plate 210 without encountering the obstacle.

In this embodiment the docking equipment 220 is included on a set of docking equipment plates 222. To facilitate the correct attachment of plates 222 to head plate 12, head plate 12 is machined in similar manner to the machining of attachment region 34 but nearer to its edge to form docking equipment plate attachment regions (not shown) which would include location and attachment items such as threaded holes and dowel pins.

It should be noted that to successfully implement the embodiment shown in FIGS. 1 and 2, that the software that drives the tester and probe station must be adjusted to account for the difference in location between the tooling plate major aperture 212 and head plate original major aperture 14.

The terms and expressions which have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of retrofitting a probe station having an original head plate, so that said probe station may be easily configured to mate with a probe card dish and any tester out of a set of testers, said method comprising the steps of:

(a) removing said original head plate from said probe station;

(b) machinery said original head plate to provide having a head plate-tooling plate attachment region, including head plate-tooling plate attachment region alignment items;

(c) attaching said replacement headplate to said probe station; and (d) providing a set of tooling plates, each having fastening and alignment items adapted to easily mate to said head plate-tooling plate attachment region alignment items and defining an aperture designed to engage a probe card dish and including docking equipment adapted to facilitate docking to a tester out of said set of testers, said set of tooling plates including, for each particular tester out of said set of testers, a tooling plate adapted to facilitate attachment to said particular tester.

2. The method of claim 1, wherein said head plate tooling plate attachment region includes a depression machined into said head plate, adapted to receive and retain one of said tooling plates.

3. The method of claim 1 wherein said head plate-tooling plate attachment region alignment items include a first set of threaded holes positioned to permit the attachment of a first tooling plate having a first dimension and a second set of threaded holes positioned to permit the attachment of a second tooling plate having a second dimension.

4. A method of retrofitting a probe station having a head plate that defines an original head plate major aperture, so that said. probe station is adapted to mate with a predetermined probe card dish and a predetermined tester that said probe station could not mate with prior to being retrofitted, said method comprising the steps of:

(a) removing said original head plate from said probe station;

(b) machinery said original head plate to provide a head plate-tooling plate attachment region, including head plate-tooling plate attachment region alignment items and having a larger major aperture than said original head plate;

(c) attaching said replacement headplate to said probe station;

(d) providing a tooling plate having tooling plate fastening and alignment items adapted to mate to said head plate-tooling plate attachment region alignment items and defining a tooling plate major aperture designed to engage said predetermined probe card dish and wherein said tooling plate major aperture is positioned relative to said tooling plate fastening and alignment items such that once said tooling plate is installed said tooling plate major aperture will not be coincident to said original head plate major aperture; and (e) mating and fastening said tooling plate to said head plate-tooling plate attachment region, using said alignment and fastening items.

5. The method of claim 4 wherein said head plate tooling plate attachment region includes a depression machined into said head plate, adapted to receive and retain said tooling plate.

6. The method of claim 4 wherein said tooling plate further includes docking equipment adapted to facilitate the docking of said predetermined tester.

7. The method of claim 4 wherein said head plate-tooling plate attachment region alignment items include a first set of threaded holes positioned to permit the attachment of a first tooling plate having a first dimension and a second set of threaded holes positioned to permit the attachment of a second tooling plate having a second dimension.

8. The method of claim 4 wherein said probe station has a configuration in which an obstacle is positioned too close to said original head plate major aperture to permit the docking of a preferred tester but wherein said tooling plate major aperture, once installed, is far enough away from said obstacle to permit docking.

9. A method of retrofitting a probe station having a horizontal extent and including an original head plate, so that said probe station can mate with a probe card dish and with a tester that includes docking equipment that extends horizontally beyond said horizontal extent of said probe station, said method comprising:

(a) removing said original head plate from said probe station;

(b) machinery said original providing a replacement head plate to provide a head plate-tooling plate attachment region, including head plate-tooling plate attachment region alignment items and also having at least one docking equipment attachment plate attachment region having docking equipment attachment plate alignment items;

(c) providing at least one docking equipment attachment plate adapted to mate to said attachment region and including a piece of docking equipment;

(d) providing a toolin plate defining an aperture adapted to support said probe card dish;

(e) attaching each said docking equipment attachment plate to a corresponding docking equipment attachment plate attachment region so that said docking equipment attachment plate protrudes horizontally outwardly from said replacement head plate and supports said piece of docking equipment outwardly of said replacement headplate; and (f) attaching said tooling plate to said head plate-tooling plate attachment region.

10. The method of claim 9 wherein said replacement head plate includes a head plate-tooling plate attachment region that includes a depression machined into said head plate, adapted to receive and retain said tooling plate.

* * * * *

UNITED STATES PATENT AND TRADEMARK OFFICE
CERTIFICATE OF CORRECTION

PATENT NO. : 6,408,500 B1
DATED : June 25, 2002
INVENTOR(S) : James Orsillo

It is certified that error appears in the above-identified patent and that said Letters Patent is hereby corrected as shown below:

Column 1,
Line 22, change "orignal-head" to -- original head --.

Column 4,
Line 26, change "station,10" to -- station 10 --.

Column 5,
Line 8, change "machinery" to -- machining --.
Line 35, change "said." to -- said --.
Line 42, change "machinery" to -- machining --.

Column 6,
Line 31, change "machinery" to -- machining --.
Line 42, change "toolin" to -- tooling --.

Signed and Sealed this

Twentieth Day of August, 2002

*Attest:*

JAMES E. ROGAN
*Director of the United States Patent and Trademark Office*

*Attesting Officer*